United States Patent
Kurosawa et al.

(10) Patent No.: US 11,309,053 B2
(45) Date of Patent: Apr. 19, 2022

(54) SEMICONDUCTOR MEMORY DEVICE AND STORAGE DEVICE

(71) Applicant: Kioxia Corporation, Minato-ku (JP)

(72) Inventors: Takehisa Kurosawa, Yokohama (JP); Koichi Shinohara, Fujisawa (JP); Yusuke Tanefusa, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 17/009,404

(22) Filed: Sep. 1, 2020

(65) Prior Publication Data
US 2021/0082536 A1    Mar. 18, 2021

(30) Foreign Application Priority Data

Sep. 13, 2019 (JP) .............................. JP2019-167215

(51) Int. Cl.
| | | |
|---|---|---|
| *G11C 29/44* | (2006.01) | |
| *G11C 29/12* | (2006.01) | |
| *G11C 29/42* | (2006.01) | |
| *G11C 29/14* | (2006.01) | |

(52) U.S. Cl.
CPC ........ *G11C 29/44* (2013.01); *G11C 29/12015* (2013.01); *G11C 29/14* (2013.01); *G11C 29/42* (2013.01); *G11C 2029/4402* (2013.01)

(58) Field of Classification Search
CPC ... G11C 29/44; G11C 29/12015; G11C 29/42; G11C 29/14; G11C 2029/4402; G11C 29/028
See application file for complete search history.

(56) References Cited

U.S. PATENT DOCUMENTS

| | | | |
|---|---|---|---|
| 2009/0172213 A1* | 7/2009 | Jayachandran | G06F 3/0659 710/19 |
| 2010/0325372 A1 | 12/2010 | Housty et al. | |
| 2015/0100744 A1* | 4/2015 | Mirichigni | G06F 12/0246 711/154 |
| 2016/0239206 A1* | 8/2016 | Yun | G06F 3/0688 |
| 2018/0350414 A1 | 12/2018 | Park et al. | |
| 2019/0122714 A1 | 4/2019 | Shin et al. | |

* cited by examiner

*Primary Examiner* — Mohammed A Bashar
(74) *Attorney, Agent, or Firm* — Oblon, McClelland, Maier & Neustadt, L.L.P.

(57) ABSTRACT

According to one embodiment, a semiconductor memory device includes a memory cell array, a processing circuit, a timer, a command decoder, and a training circuit. The memory cell array includes a plurality of memory cells. The processing circuit writes data into the memory cell array. The timer sets a waiting time. The command decoder receives a command output from a memory controller. The training circuit waits until the waiting time has passed since a predetermined command is received by the command decoder and performs a process relating to determination of a correction value for a signal sent from the memory controller to the processing circuit based on reference data output from the memory controller after the waiting time has passed.

12 Claims, 8 Drawing Sheets

|  | ADDRESS |
|---|---|
| SEMICONDUCTOR MEMORY DEVICE 10a-1 | 0 |
| SEMICONDUCTOR MEMORY DEVICE 10a-2 | 1 |
| SEMICONDUCTOR MEMORY DEVICE 10a-3 | 2 |

SEMICONDUCTOR MEMORY DEVICE AND STORAGE DEVICE

CROSS-REFERENCE TO RELATED APPLICATION

This application is based upon and claims the benefit of priority from Japanese Patent Application No. 2019-167215, filed Sep. 13, 2019; the entire contents of which are incorporated herein by reference.

FIELD

Embodiments described herein relate generally to a semiconductor memory device and a storage device.

BACKGROUND

A semiconductor memory device that determines a correction value for a signal by performing training is known. It is expected that the operation of such semiconductor memory devices should be more efficient.

DETAILED DESCRIPTION

According to one embodiment, a semiconductor memory device of an embodiment includes a memory cell array, a processing circuit, a timer, a command decoder, and a training circuit. The memory cell array includes a plurality of memory cells. The processing circuit writes data into the memory cell array. The timer sets a waiting time. The command decoder receives a command output from a memory controller. The training circuit waits until the waiting time has passed since a predetermined command is received by the command decoder and performs a process relating to determination of a correction value for a signal sent from the memory controller to the processing circuit based on reference data output from the memory controller after the waiting time has passed.

Hereinafter, a semiconductor memory device and a storage device according to an embodiment will be described with reference to the drawings. In the following description, constituents having the same or similar functions are designated by the same reference numerals. In addition, duplicate descriptions of the constituents may be omitted. Further, as used in the specification, "based on XX" means "based at least on XX" and also includes a case based on another element in addition to XX. Further, "based on XX" is not limited to a case in which XX is used directly and also includes a case in which XX is based on a calculation or processing. "XX" is an arbitrary element (for example, arbitrary information). In this specification, "connection" also includes a case of electrical connection.

First Embodiment

Figure 1:
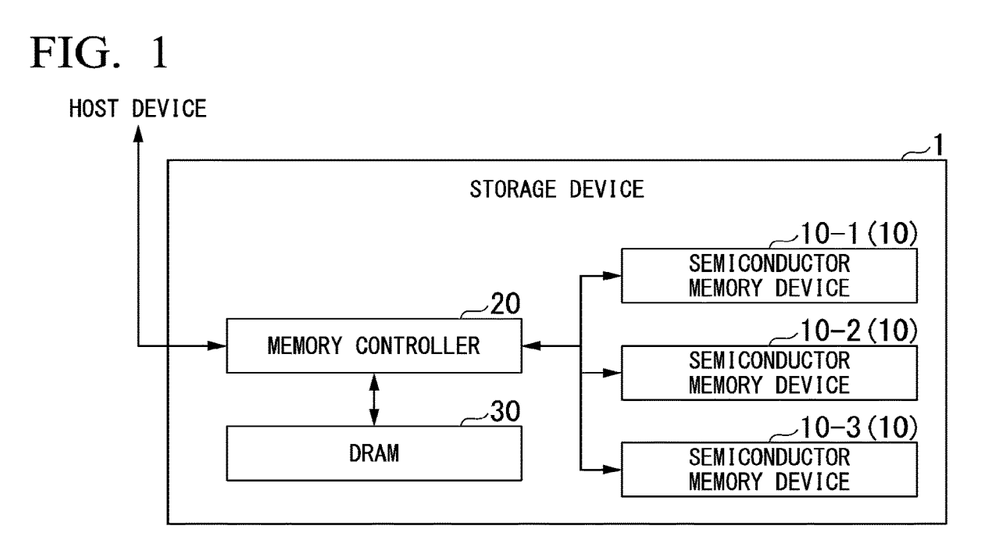
FIG. 1 is a block diagram showing a constitution of a storage device according to a first embodiment.

FIG. 1 is a block diagram showing a constitution of a storage device 1 according to a first embodiment. The storage device 1 is to be connected to a host device in a communicative manner and to be used as a storage space for the host device. The storage device 1 is, for example, a storage device such as a solid state drive (SSD). The storage device 1 is mounted in, for example, a server device in a data center or an information processing device such as a personal computer (hereinafter, referred to as a "PC"). However, the storage device 1 is not limited thereto and may be, for example, a universal serial bus (USB) memory or an SD (registered trademark) memory card. The storage device 1 is also referred to as a memory system.

The host device is, for example, a server device in a data center or an information processing device such as a PC, but is not limited thereto. The host device broadly refers to a system to which the storage device 1 is connected in a communicative manner. The host device may be referred to as an "external device".

For example, when data (hereinafter, referred to as "communication data") is written into the storage device 1, the host device outputs a write command to the storage device 1. The "command" broadly means an instruction which causes a computer (for example, the storage device 1) to execute a target process. The "command" in this application is not limited to an instruction output by the host device, and includes an instruction generated inside the storage device 1 based on an instruction received from the host device, and an instruction regarding an internal process of the storage device 1. The "command" may be read as "instruction", "order", "signal", or the like. The "write command" is a command which includes information which indicates a write destination of communication data (for example, a write destination logical address).

Further, the host device outputs a read command to the storage device 1, for example, when the communication data written in the storage device 1 is read. The "read command" is a command which includes information which indicates a read destination of communication data to be read by the host device (for example, a read destination logical address).

Further, the host device outputs an erase command to the storage device 1, for example, when at least a part of the communication data written in the storage device 1 is to be erased. The "erase command" is a command which designates a region in which the communication data to be erased is written.

As shown in FIG. 1, the storage device 1 includes a plurality of (for example, three) semiconductor memory devices 10, a memory controller 20, a DRAM 30, and a case (not shown) which accommodates these elements. However, the number of semiconductor memory devices 10 may be two, or more than three as long as the number is plural.

Each of the plurality of semiconductor memory devices 10 and the memory controller 20 constitute a module mounted on the same board (not shown). The board is, for example, a printed circuit board. The plurality of semiconductor memory devices 10, the memory controller 20, and the DRAM 30 are mounted on this board.

The semiconductor memory device 10 is an example of a semiconductor module. The plurality of semiconductor memory devices 10 are arranged and disposed on the board. The plurality of semiconductor memory devices 10 are electrically connected to the memory controller 20 in parallel with each other. The constitution and function of the semiconductor memory device 10 will be described later in detail. The semiconductor memory device 10 is, for example, a nonvolatile memory device, and is, for example, a NAND flash memory.

The memory controller 20 is located between the host device and each of the plurality of semiconductor memory devices 10. The memory controller 20 controls the plurality of semiconductor memory devices 10 as a whole.

The DRAM (dynamic random access memory) 30 holds various management data. Further, the DRAM 30 serves as a cache memory. Other storage media may be used instead of the DRAM 30.

Figure 2:
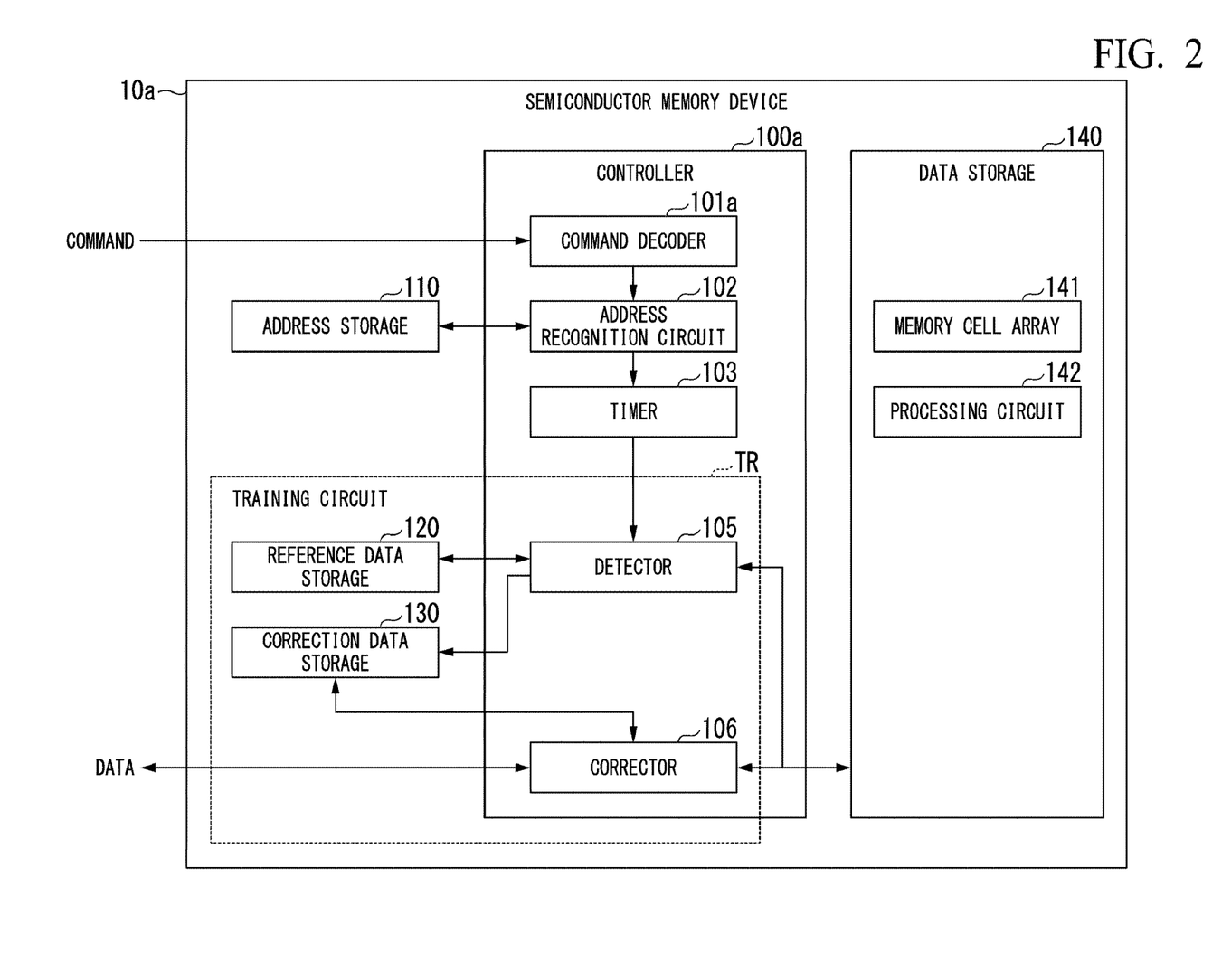
FIG. 2 is a block diagram showing a constitution of a semiconductor memory device according to the first embodiment.

Next, a constitution of a semiconductor memory device 10a according to the first embodiment will be described. FIG. 2 is a block diagram showing the constitution of the semiconductor memory device 10a according to the first embodiment. As shown in FIG. 2, the semiconductor memory device 10a includes a controller 100a, an address storage 110, a reference data storage 120, a correction data storage 130, and a data storage 140. Further, the controller 100a includes a command decoder 101a, an address recognition circuit 102, a timer 103, a detector 105, and a corrector 106. Furthermore, the detector 105, the corrector 106, the reference data storage 120, and the correction data storage 130 constitute a training circuit TR.

The controller 100a controls various processes in the semiconductor memory device 10a based on the command received from the memory controller 20. The various processes referred to in this specification include writing of communication data to the data storage 140, reading or erasing of communication data stored in the data storage 140, communication training between the own semiconductor memory device 10a and the memory controller 20, or the like. Here, the communication training is a timing adjustment of mutual processing between the semiconductor memory device 10a and the memory controller 20.

The command decoder 101a receives various commands output from the memory controller 20. The various commands here are, for example, the above-described write command, read command, erase command, or the like. In addition, the various commands referred to here also include a "training command". The training command is a command which indicates an instruction to execute the communication training between the semiconductor memory device 10a and the memory controller 20. The training command is output from the memory controller 20 to each of the semiconductor memory devices 10 at the time of, for example, starting up the storage device 1, changing a setting, or the like.

When receiving the command, the command decoder 101a identifies a type of the command. For example, the command decoder 101a refers to information in which a command is associated with the type of the command (hereinafter, referred to as "correspondence information"). The correspondence information is stored in advance in, for example, a storage medium (not shown) included in the semiconductor memory device 10a. The command decoder 101a compares the received commands with the command included in the correspondence information, to identify the type of the received command.

The controller 100a performs various processes according to the type of the received command. For example, in a case where the command received by the command decoder 101a is a write command, the controller 100a write the communication data to the data storage 140. Further, for example, in a case where the command received by the command decoder 101a is a read command, the controller 100a reads the communication data stored in the data storage 140. Furthermore, for example, in a case where the command received by the command decoder 101a is an erase command, the controller 100a performs erasing of the communication data stored in the data storage 140.

In addition, in a case where the received command is a training command, the command decoder 101a outputs a predetermined signal to the address recognition circuit 102.

When the predetermined signal is input from the command decoder 101a to the address recognition circuit 102, the address recognition circuit 102 reads an address stored in the address storage 110.

The address storage 110 stores in advance information which indicates an address uniquely assigned to the own semiconductor memory device 10a.

Figure 3:
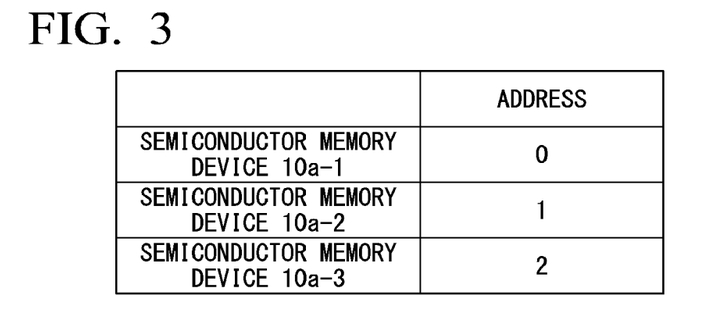
FIG. 3 is a view showing an example of correspondence between the semiconductor memory devices and addresses according to the first embodiment.

For example, an address as shown in FIG. 3 is assigned to each of the semiconductor memory devices 10a in advance. FIG. 3 is a view showing an example of correspondence between the semiconductor memory devices 10a and addresses according to the first embodiment.

As shown in FIG. 3, "0" is assigned to a semiconductor memory device 10a-1 as an address value. Similarly, "1" is assigned to a semiconductor memory device 10a-2 as the address value. Similarly, "2" is assigned to a semiconductor memory device 10a-3 as the address value. As described above, the address is a value which is unique to each of the semiconductor memory devices 10a and is assigned in advance to be a continuous value.

The address recognition circuit 102 determines a time to be set in the timer 103 based on the received address value and a length of a predetermined period. The address recognition circuit 102 sets the determined time in the timer 103.

Here, the predetermined period corresponds to a length of time required for one communication training. For example, it is assumed that the time required for one communication training is 100 microseconds. In the case of the semiconductor memory device 10a-1, since "0" is assigned as the address as shown in FIG. 3, for example, the address recognition circuit 102 multiplies 0 by 100 and sets the calculation result (0 microsecond) to the timer 103. Similarly, in the case of the semiconductor memory device 10a-2, since "1" is assigned as the address as shown in FIG. 3, for example, the address recognition circuit 102 multiplies 1 by 100 and sets the calculation result (100 microseconds) to the timer 103. Similarly, in the case of the semiconductor memory device 10a-3, since "2" is assigned as the address as shown in FIG. 3, for example, the address recognition circuit 102 multiplies 2 by 100 and sets the calculation result (200 microseconds) to the timer 103.

The timer 103 outputs an enable signal to the training circuit TR (the detector 105) at a timing when the time set by the address recognition circuit 102 has passed. Thus, the training circuit TR starts execution of the communication training. The start of the execution of the communication training refers to the start of the communication training between the semiconductor memory device 10a and the memory controller 20. Further, as described above, the communication training refers to performing a timing adjustment of the mutual processing between the semiconductor memory device 10a and the memory controller 20.

The detector 105 receives the enable signal output from the timer 103. When receiving the enable signal, the detector 105 receives the data output from the memory controller 20. The constitution of the corrector 106 will be described later.

Here, the data received by the detector 105 is reference data. The reference data here is known data which is recognized in advance by both the semiconductor memory device 10a and the memory controller 20.

The reference data storage 120 stores the reference data in advance. The detector 105 compares the reference data received from the memory controller 20 with the reference data stored in the reference data storage 120, to generate correction data. The correction data is, for example, a difference value between the reference data received from the memory controller 20 and the reference data stored in the reference data storage 120.

The correction data is not limited to a difference value and may be, for example, a parameter of a calculation formula for correcting the difference value. The correction data may be data for correcting a phase of a signal which indicates the reference data, a waveform shape of the signal, or a duty ratio of the signal.

The correction data storage 130 stores the correction data. The detector 105 stores the generated correction data in the correction data storage 130.

The memory controller 20 broadcasts a common training command to all the semiconductor memory devices 10a and then sequentially outputs the reference data for each of the semiconductor memory devices 10a at a predetermined timing (for example, following the above-described broadcast).

The corrector 106 receives the communication data output from the memory controller 20. The corrector 106 corrects the received communication data using the correction data stored in the correction data storage 130. The corrector 106 writes the corrected communication data into the data storage 140.

The constitution of the corrector 106 described above is a constitution in the case in which the command decoder 101a receives the write command, but the same applies to a case in which the read command is not received. In this case, the corrector 106 reads the communication data designated by the read command from the data storage 140. The corrector 106 corrects the read communication data using the correction data stored in the correction data storage 130. The corrector 106 outputs the corrected communication data to the memory controller 20.

The correction target is not limited to the communication data and may be, for example, a clock, a strobe, or the like.

The data storage 140 is a storage medium which stores a variety of data. The data storage 140 includes a memory cell array 141 and a processing circuit 142. The memory cell array 141 includes a plurality of memory cells. The processing circuit 142 performs data writing, reading, erasing, or the like on the memory cell array 141.

Figure 4:
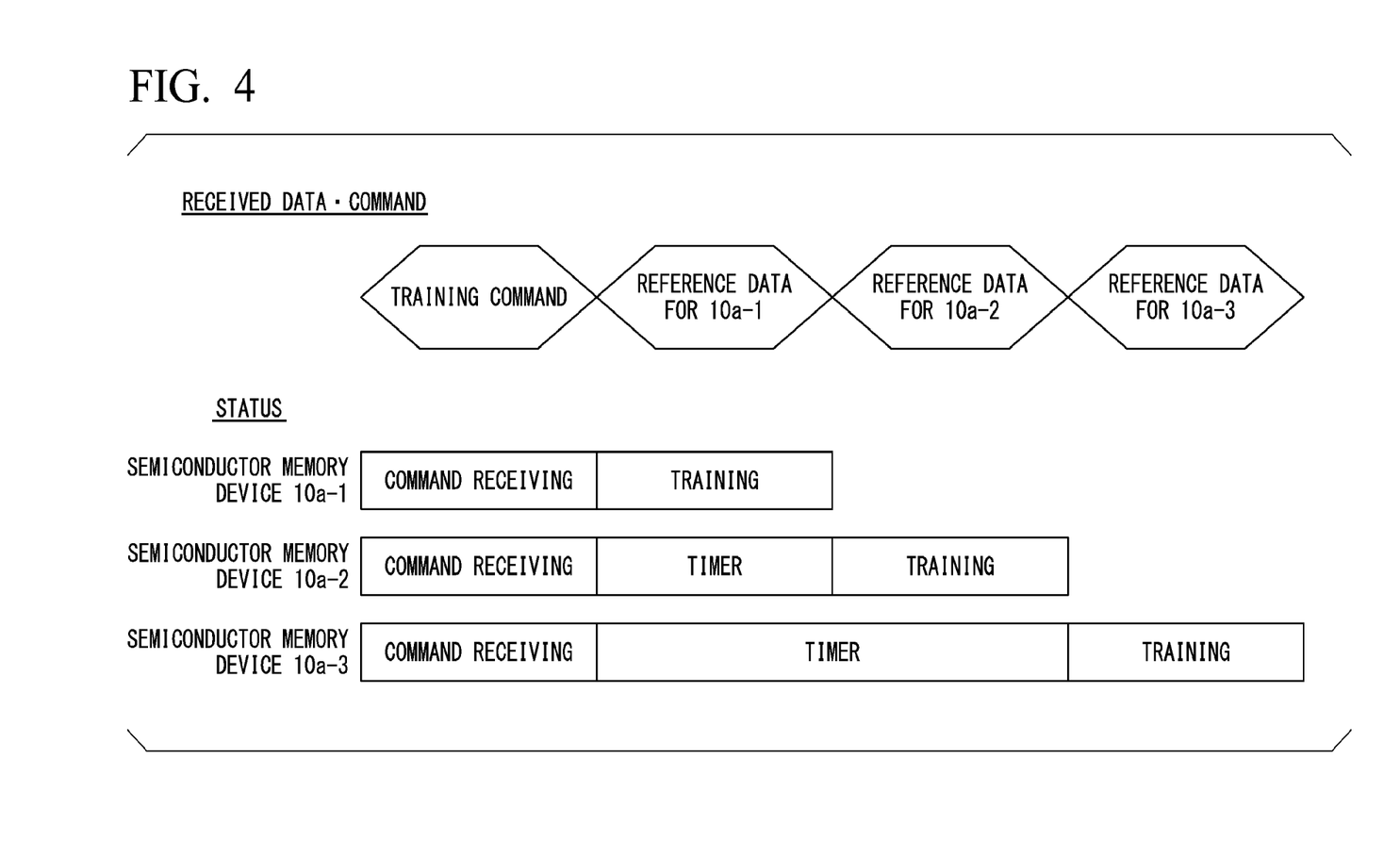
FIG. 4 is a timing chart showing a timing of receiving a training command and reference data in the semiconductor memory device according to the first embodiment.

Hereinafter, the timing of receiving the training command and the reference data in the semiconductor memory device 10a according to the first embodiment will be described with reference to the drawings. FIG. 4 is a timing chart showing a timing of receiving the training command and the reference data in the semiconductor memory device 10a according to the first embodiment.

First, the memory controller 20 outputs the common training command to all the semiconductor memory devices 10a. The training command is broadcast to all the semiconductor memory devices 10a. As shown in FIG. 4, the semiconductor memory device 10a-1, the semiconductor memory device 10a-2, and the semiconductor memory device 10a-3 receive the training command output from the memory controller 20.

When receiving the training command, each of the semiconductor memory devices 10a sets a time for the timer 103. For example, 0 microsecond is set in the timer 103 of the semiconductor memory device 10a-1, 100 microsecond is set in the timer 103 of the semiconductor memory device 10a-2, and 200 microsecond is set in the timer 103 of the semiconductor memory device 10a-3.

After outputting the training command, the memory controller 20 next outputs the reference data for the semiconductor memory device 10a-1 (hereinafter, referred to as "reference data for 10a-1"). The reference data is broadcast to all the semiconductor memory devices 10a. The semiconductor memory device 10a-1, the semiconductor memory device 10a-2, and the semiconductor memory device 10a-3 receive the reference data for 10a-1 output from the memory controller 20.

Here, the timer is set so that the training circuit TR of the semiconductor memory device 10a-1 is validated at the timing when the semiconductor memory device 10a-1 receives the reference data for 10a-1 output from the memory controller 20.

The semiconductor memory device 10a-1 performs the communication training using the reference data for 10a-1 which is reference data for its own device. On the other hand, the semiconductor memory devices 10a-2 and the semiconductor memory device 10a-3 are in a waiting state since the time set in the timer 103 has not passed.

After outputting the reference data for 10a-1, the memory controller 20 outputs the reference data for the semiconductor memory device 10a-2 (hereinafter, referred to as "reference data for 10a-2"). The semiconductor memory devices 10a-1, the semiconductor memory device 10a-2, and the semiconductor memory device 10a-3 receive the reference data for 10a-2 output from the memory controller 20.

Here, the timer is set so that the training circuit TR of the semiconductor memory device 10a-2 is validated at the timing when the semiconductor memory device 10a-2 receives the reference data for 10a-2 output from the memory controller 20.

The semiconductor memory device 10a-2 performs the communication training using the reference data for 10a-2 which is reference data for its own device. On the other hand, the semiconductor memory devices 10a-3 is still in the waiting state since the time set in the timer 103 has not passed.

After outputting the reference data for 10a-2, the memory controller 20 outputs the reference data for the semiconductor memory device 10a-3 (hereinafter, referred to as "reference data for 10a-3"). The semiconductor memory devices 10a-1, the semiconductor memory device 10a-2, and the semiconductor memory device 10a-3 receive the reference data for 10a-3 output from the memory controller 20.

Here, the timer is set so that the training circuit TR of the semiconductor memory device 10a-3 is validated at the timing when the semiconductor memory device 10a-3 receives the reference data for 10a-3 output from the memory controller 20.

The semiconductor memory device 10a-3 performs the communication training using the reference data for 10a-3 which is reference data for its own device.

As described above, in the storage device 1 including the semiconductor memory device 10a according to the first embodiment, for example, in a case where the number of semiconductor memory devices 10a is three, one training command output period and three reference data output periods are required to complete the communication training between all the semiconductor memory devices 10a and the memory controller 20. That is, for example, in a case where the number of the semiconductor memory devices 10a is three, a total of four periods are required.

As a comparative example, a case in which, for example, the memory controller 20 sequentially outputs the training command and the reference data for each of the semiconductor memory devices 10a is considered. In this case, for example, in a case where the number of semiconductor memory devices 10a is three, three training command output period and three reference data output periods are required. That is, for example, in a case where the number of the semiconductor memory devices 10a is three, a total of six periods are required.

On the other hand, in the storage device 1 including the semiconductor memory device 10a according to the first embodiment, as described above, the communication training between each of the semiconductor memory devices 10a and the memory controller 20 can be completed in a total of four periods. In this way, the storage device 1 according to the first embodiment can reduce the time required for communication training.

Figure 5:
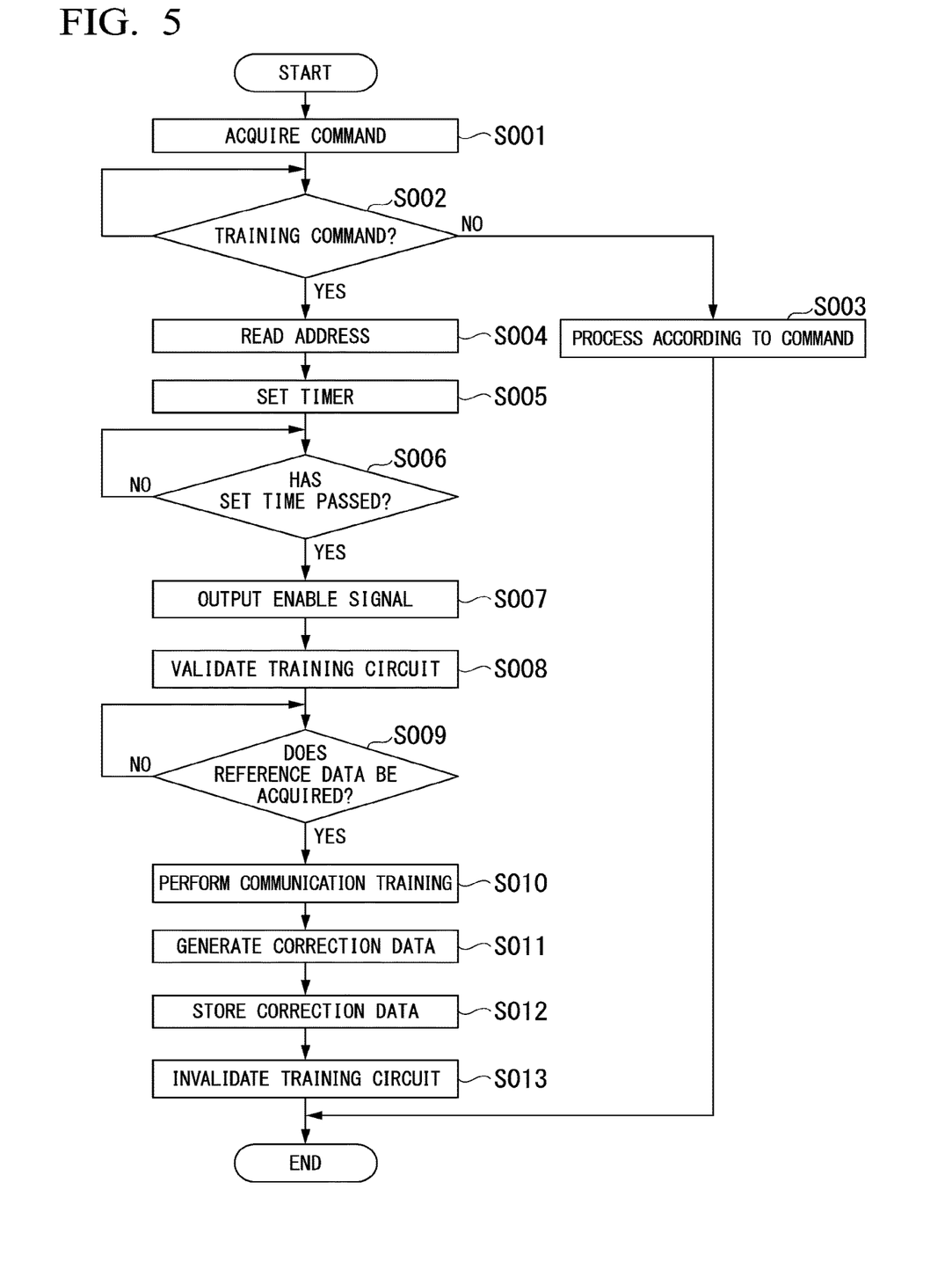
FIG. 5 is a flowchart showing an operation of the semiconductor memory device according to the first embodiment.

Next, an example of an operation of the semiconductor memory device 10a according to the first embodiment will be described with reference to the drawings. FIG. 5 is a flowchart showing the operation of the semiconductor memory device 10a according to the first embodiment.

The command decoder 101a receives a command output from the memory controller 20 (Step S001). The command decoder 101a identifies the type of the received command. In a case where the received command is not the training command (No in Step S002), the controller 100a performs various processes according to the type of the received command (Step S003).

In a case where the received command is the training command (Yes in Step S002), the command decoder 101a outputs a predetermined signal to the address recognition circuit 102. When receiving the predetermined signal from the command decoder 101a, the address recognition circuit 102 reads the address stored in the address storage 110 (Step S004). The address recognition circuit 102 determines a time to be set in the timer 103 based on the received address value and a length of the predetermined period. The address recognition circuit 102 sets the determined time in the timer 103 (Step S005).

When the time set by the address recognition circuit 102 has not passed (No in Step S006), the timer 103 is in the waiting state. When the time set by the address recognition circuit 102 has passed (Yes in Step S006), the timer 103 outputs the enable signal to the training circuit TR (the detector 105) (Step S007). When receiving the enable signal output from the timer 103, the detector 105 validates its own training circuit TR (Step S008).

The detector 105 waits until receiving the reference data output from the memory controller 20 (No in Step S009). When receiving the reference data (Yes in Step S009), the detector 105 starts the execution of the communication training (Step S010).

The detector 105 compares the reference data received from the memory controller 20 with the reference data stored in the reference data storage 120, to generate correction data (Step S011). The detector 105 stores the generated correction data in the correction data storage 130 (Step S012). When the communication training is ended, the detector 105 invalidates its own training circuit TR (Step S013). Thus, the operation of the semiconductor memory device 10a shown in the flowchart of FIG. 5 is ended.

As described above, the storage device 1 according to the first embodiment includes the memory controller 20 which broadcasts the training command to the plurality of semiconductor memory devices 10a. Then, after broadcasting the training command, the memory controller 20 sequentially outputs the reference data to each of the semiconductor memory devices 10a at different timings. Further, the storage device 1 has the plurality of semiconductor memory devices 10a including the command decoder 101a which receives a command output from the memory controller 20. Furthermore, when the command decoder 101a receives the training command, each of the semiconductor memory devices 10a performs the communication training using the reference data received at a different timing for each of the semiconductor memory devices 10a.

Specifically, each of the semiconductor memory devices 10a sets the timer 103 so that the training circuit TR is validated at a timing when receiving the reference data for its own semiconductor memory device 10a. Here, the time set in the timer 103 is determined based on, for example, the address value uniquely assigned to be a continuous value in the plurality of semiconductor memory devices 10a and a time required for communication training.

With the above-described constitution, the storage device 1 according to the first embodiment can start the communication training in all the semiconductor memory devices 10a in order only by broadcasting the common training command only once from the memory controller to all the semiconductor memory devices 10a. That is, the storage device 1 can reduce an output time of the training command to an output time of one training command. Thus, efficiency of the operation of the storage device 1 can be improved.

Second Embodiment

In the above-described first embodiment, the execution start timing of the communication training in the semiconductor memory device 10a is controlled by the timer 103 provided in the semiconductor memory device 10a. Such a constitution in which the communication timing is controlled by the timer 103 can be applied, for example, to a case in which the semiconductor memory device returns, for example, the communication data or the command to the memory controller at a predetermined timing according to a request from the memory controller.

In the second embodiment described below, it is assumed that the memory controller (hereinafter, referred to as "memory controller 20b") includes a training circuit TR which performs the communication training. The memory controller 20b broadcasts a reference data request command to a plurality of semiconductor memory devices (hereinafter, referred to as "semiconductor memory devices 10b") according to a second embodiment. Here, the "reference data request command" is a command in which the memory controller 20b requests each of the semiconductor memory devices 10b to output the reference data to its own memory controller 20b. The reference data request command is output from the memory controller 20b to each of the semiconductor memory devices 10b, for example, when the storage device 2 is activated or when the setting is changed. The reference data is stored in advance in each of the semiconductor memory devices 10b.

Each of the semiconductor memory devices 10b outputs the reference data to the memory controller 20b at a timing when a time set in the timer 103 has passed. The time set in the timer 103 is determined based on, for example, an address value which is uniquely assigned to be a continuous value in the plurality of semiconductor memory devices 10b and a time required for outputting the reference data. Accordingly, the memory controller 20b can sequentially receive the reference data output from the plurality of semiconductor memory devices 10b at different timings.

Hereinafter, the overall constitution of the storage device 2 according to the second embodiment will be described. Only the differences between the constitution of the storage device 2 and the constitution of the storage device 1 according to the first embodiment shown in FIG. 1 will be described.

Figure 6:
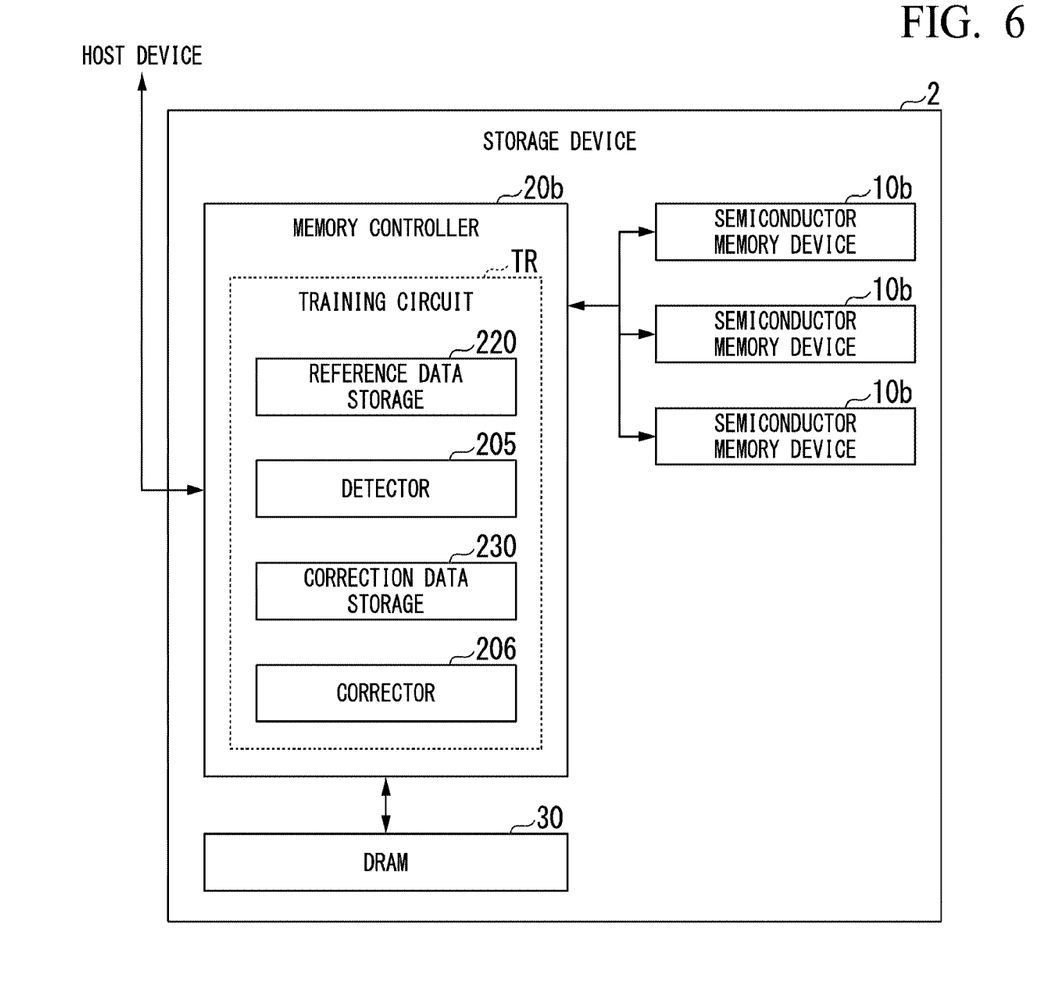
FIG. 6 is a block diagram showing a constitution of a storage device according to a second embodiment.

FIG. 6 is a block diagram showing a constitution of the storage device 2 according to the second embodiment. The storage device 2 includes a plurality of (for example, three) semiconductor memory devices 10b, a memory controller 20b, a DRAM 30, and a case (not shown) which accommodates these elements. The memory controller 20b includes a training circuit TR. The training circuit TR includes a reference data storage 220, a detector 205, a correction data storage 230, and a corrector 206. The constitutions of the reference data storage 220, the detector 205, the correction data storage 230, and the corrector 206 respectively correspond to the constitutions of the reference data storage 120, the detector 105, the correction data storage 130, and the corrector 106 of the storage device 1 according to the first embodiment.

The memory controller 20b broadcasts a reference data request command to the plurality of semiconductor memory devices 10b. Then, the detector 205 of the memory controller 20b sequentially receives the reference data output from each of the plurality of semiconductor memory devices 10b at different timings.

When receiving the reference data, the detector 205 starts execution of the communication training. The detector 205 compares the reference data received from the semiconductor memory device 10b with reference data stored in the reference data storage 220 in advance, to generate correction data. The detector 205 stores the generated correction data in the correction data storage 230.

Then, when receiving the communication data output from the semiconductor memory device 10b, the corrector 206 corrects the received communication data using the correction data stored in the correction data storage 230. The corrector 206 outputs the corrected communication data to the host device. Further, when receiving the communication data output from the host device, the corrector 206 corrects the received communication data using the correction data stored in the correction data storage 230. The corrector 206 outputs the corrected communication data to the semiconductor memory device 10b.

Figure 7:
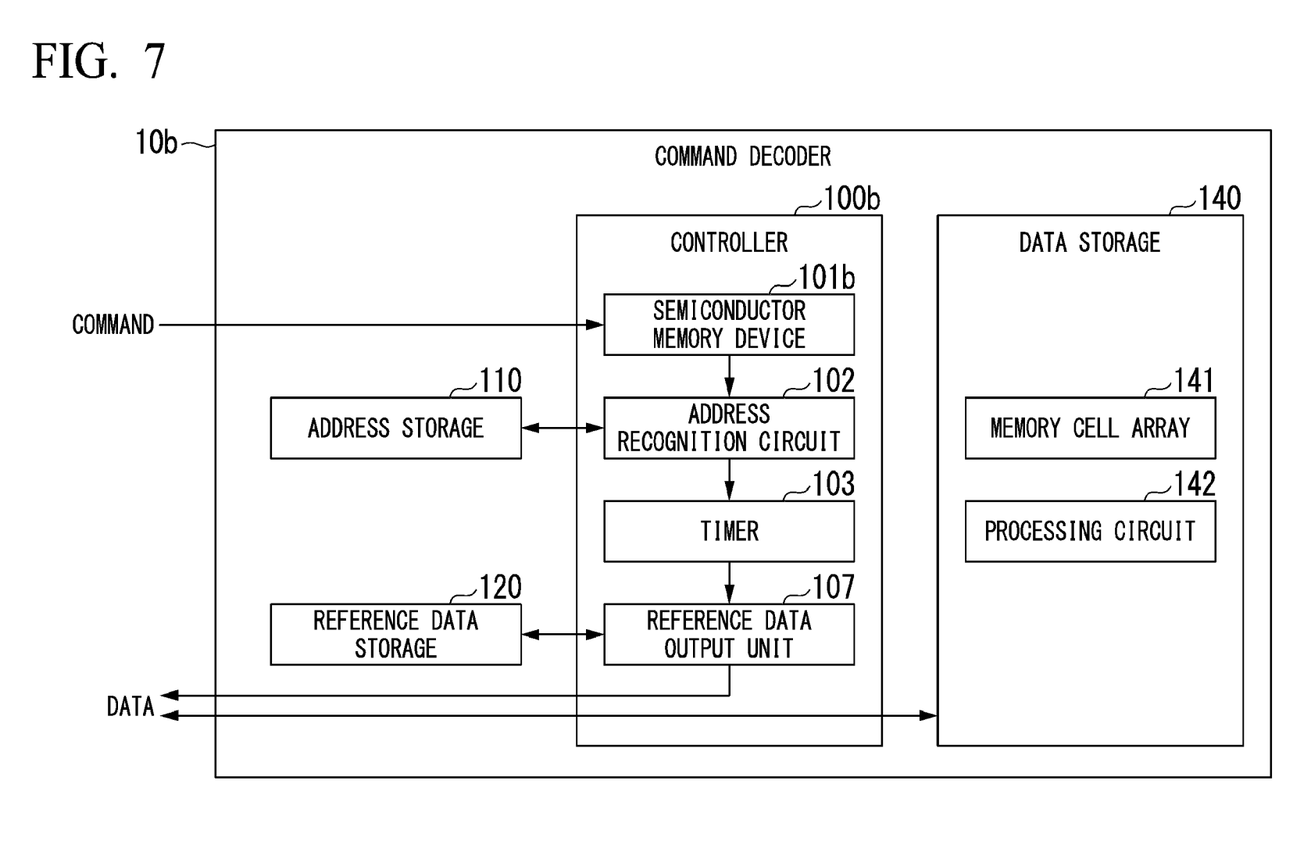
FIG. 7 is a block diagram showing a constitution of a semiconductor memory device according to the second embodiment.

Hereinafter, the constitution of the semiconductor memory device 10b according to the second embodiment will be described. FIG. 7 is a block diagram showing the constitution of the semiconductor memory device 10b according to the second embodiment. As shown in FIG. 7, the semiconductor memory device 10b includes a controller 100b, an address storage 110, a reference data storage 120, and a data storage 140. Further, the controller 100b includes a command decoder 101b, an address recognition circuit 102, a timer 103, and a reference data output unit 107.

The controller 100b controls various processes in the semiconductor memory device 10b based on the command received from the memory controller 20. The various processes referred to this specification include, for example, writing of the communication data to the data storage 140, reading or erasing of communication data stored in the data storage 140, and outputting of the reference data to the memory controller 20.

The command decoder 101b receives various commands output from the memory controller 20. The various commands here are, for example, the above-described write command, read command, erase command, or the like. In addition, the various commands also include the above-described reference data request command.

When receiving the command, the command decoder 101b identifies a type of the command. For example, the command decoder 101b refers to correspondence information in which a command is associated with the type of the command. The correspondence information is stored in advance in, for example, a storage medium (not shown) included in the semiconductor memory device 10b. The command decoder 101b compares the received command with the command included in the correspondence information, to identify the type of the received command.

The controller 100b performs various processes according to the type of the received command. In a case where the received command is the reference data request command, the command decoder 101b outputs a predetermined signal to the address recognition circuit 102.

When the predetermined signal is input from the command decoder 101b to the address recognition circuit 102, the address recognition circuit 102 reads the address stored in the address storage 110.

The address storage 110 stores in advance information which indicates an address uniquely assigned to its own semiconductor memory device 10b. As in the above-described first embodiment, the address is a value which is unique to each of the semiconductor memory devices 10b and is assigned in advance to be a continuous value.

The address recognition circuit 102 determines a time to be set in the timer 103 based on the received address value and a length of a predetermined period. The address recognition circuit 102 sets the determined time in the timer 103.

Here, the predetermined period corresponds to a length of time required for outputting the reference data to the memory controller 20. It is assumed that the length of time required for outputting the reference data to the memory controller 20 is the same in each of the semiconductor memory devices 10b. For example, it is assumed that the time required for outputting the reference data is 100 microseconds. Further, for example, the number of the semiconductor memory devices 10b is three including a semiconductor memory device 10b-1, a semiconductor memory device 10b-2, and a semiconductor memory device 10b-3. In this case, for example, "0", "1", and "2" are assigned in advance to the semiconductor memory devices 10b-1, 10b-2, and 10b-3 as addresses.

Additionally, in the case of the semiconductor memory device 10b-1, since "0" is assigned as the address, for example, the address recognition circuit 102 multiplies 0 by 100 and sets the calculation result (0 microsecond) to the timer 103. Similarly, in the case of the semiconductor memory device 10b-2, since "1" is assigned as the address, for example, the address recognition circuit 102 multiplies 1 by 100 and sets the calculation result (100 microseconds) to the timer 103. Similarly, in the case of the semiconductor memory device 10b-3, since "2" is assigned as the address, for example, the address recognition circuit 102 multiplies 2 by 100 and sets the calculation result (200 microseconds) to the timer 103.

The timer 103 outputs an enable signal to the reference data output unit 107 at a timing when the time set by the address recognition circuit 102 has passed.

The reference data storage 120 stores the reference data in advance.

The reference data output unit 107 receives the enable signal output from the timer 103. When receiving the enable signal output from the timer 103, the reference data output unit 107 reads the reference data stored in the reference data storage 120. Additionally, the reference data output unit 107 outputs the read reference data to the memory controller 20. The reference data output unit 107 is an example of a "data output unit".

The data storage 140 is a storage medium which stores a variety of data. The data storage 140 includes a memory cell array 141 and a processing circuit 142. The memory cell array 141 includes a plurality of memory cells. The processing circuit 142 performs data writing, reading, erasing, or the like on the memory cell array 141.

The data storage 140 stores, for example, communication data. The communication data stored in the data storage 140 is read, for example, according to the read command output from the memory controller 20. Then, the read communication data is corrected by the corrector 206 of the memory controller 20b as described above. Further, the communication data stored in the data storage 140 is written according to, for example, the write command output from the memory controller 20. The communication data written in this case is communication data which is output from the host device as described above and corrected by the corrector 206 of the memory controller 20b.

Figure 8:
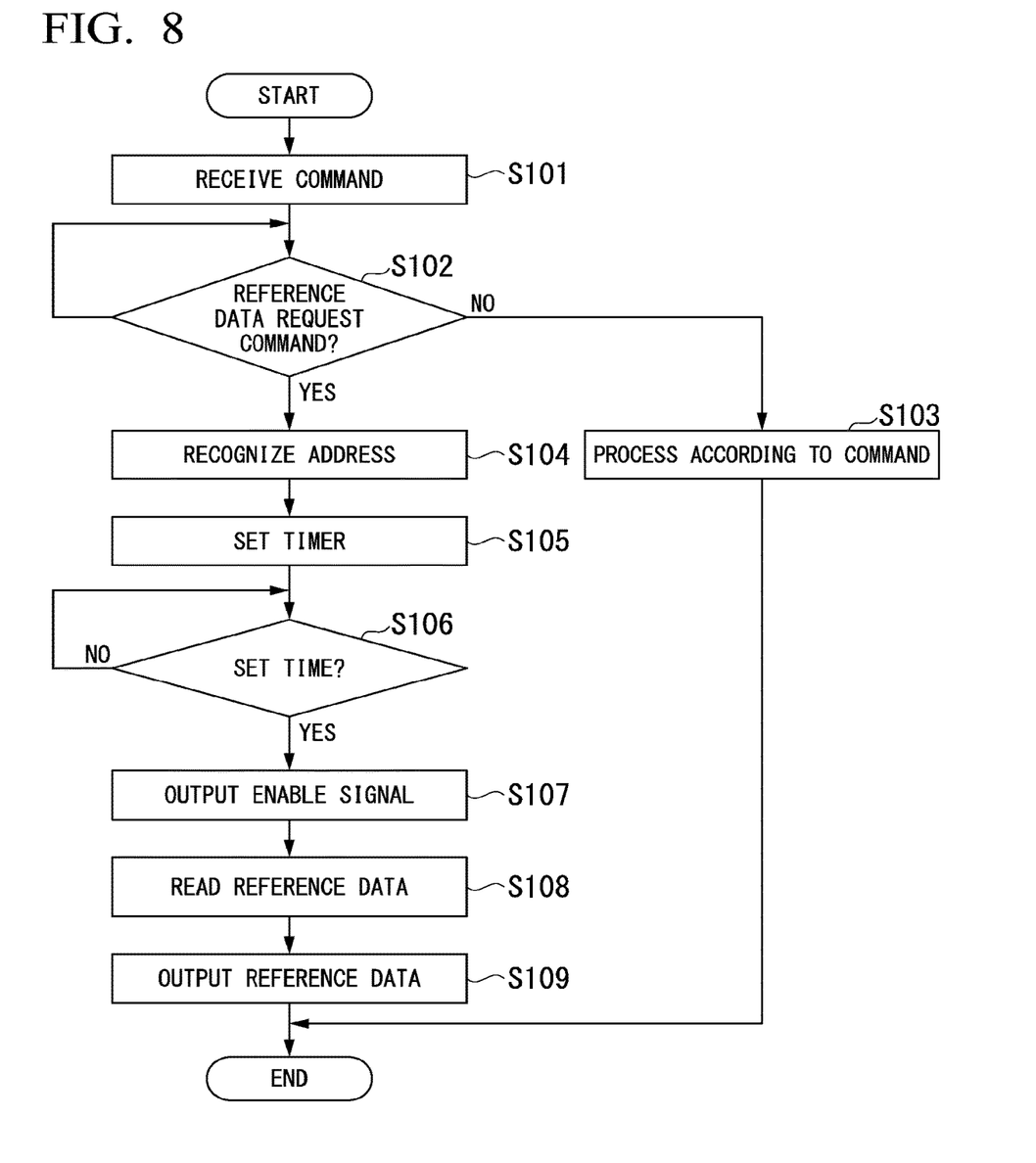
FIG. 8 is a flowchart showing an operation of the semiconductor memory device according to the second embodiment.

Next, an example of an operation of the semiconductor memory device 10b according to the second embodiment will be described with reference to the drawings. FIG. 8 is a flowchart showing the operation of the semiconductor memory device 10b according to the second embodiment.

The command decoder 101b receives a command output from the memory controller 20 (Step S101). The command decoder 101b identifies the type of the received command. In a case where the received command is not the reference data request command (Step S102: No), the controller 100b performs various processes according to the type of the received command (Step S103).

In a case where the received command is the reference data request command (Yes in Step S102), the command decoder 101b outputs a predetermined signal to the address recognition circuit 102. When receiving the predetermined signal from the command decoder 101b, the address recognition circuit 102 reads the address stored in the address storage 110 (Step S104). The address recognition circuit 102 determines a time to be set in the timer 103 based on the received address value and a length of the predetermined period. The address recognition circuit 102 sets the determined time in the timer 103 (Step S105).

When the time set by the address recognition circuit 102 has not passed (No in Step S106), the timer 103 is in the waiting state. When the time set by the address recognition circuit 102 has passed (Yes in Step S106), the timer 103 outputs the enable signal to the reference data output unit 107 (Step S107). When receiving the enable signal output from the timer 103, the reference data output unit 107 reads the reference data stored in the reference data storage 120 (Step S108).

The reference data output unit 107 outputs the read reference data to the memory controller 20 (Step S109). Thus, the operation of the semiconductor memory device 10b shown in the flowchart of FIG. 8 is ended.

As described above, each of the semiconductor memory devices 10b according to the second embodiment includes the command decoder 101b which receives the command output from the memory controller 20. Furthermore, when the command decoder 101b receives the reference data request command, each of the semiconductor memory devices 10b outputs the reference data to the memory controller 20 at a different timing for each of the semiconductor memory devices 10b.

More specifically, each of the semiconductor memory devices 10b sets the timer 103 so that the output of the reference data is performed at a predetermined timing. Here, the time set in the timer 103 is determined based on, for example, an address value uniquely assigned to be a continuous value in the plurality of semiconductor memory devices 10b and a time required for outputting reference data.

With the above-described constitution, the storage device according to the second embodiment can collect the reference data from all the semiconductor memory devices 10b in order only by broadcasting the common reference data request command only once from the memory controller 20 to all the semiconductor memory devices 10b. That is, the storage device according to the second embodiment can reduce the output time of the reference data request command to the output time of one reference data request command. Thus, efficiency of the operation of the storage device according to the second embodiment can be improved.

According to at least one embodiment described above, the storage device can improve the efficiency of the operation by including the command decoder 101 (101a and 101b) which receives the command output from the memory controller 20, and the function unit (the controller 100a and the controller 100b) which performs the communication training between the memory controller 20 and its own device at a point in time when the predetermined time has passed since the predetermined command is received by the command decoder 101 (101a and 101b).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
a first semiconductor memory device; and
a second semiconductor memory device; and
a memory controller configured to control the first semiconductor memory device and the second semiconductor memory device,
wherein the memory controller is configured to output reference data after issuing a predetermined command to the first semiconductor memory device and the second semiconductor memory device,
the first semiconductor memory device includes:
a first memory cell array including a plurality of memory cells;
a first processing circuit configured to write data into the first memory cell array;
a first timer configured to set a first waiting time;
a first command decoder configured to receive a command output from the memory controller; and
a first training circuit configured:
to wait until the first waiting time has passed since the predetermined command is received by the first command decoder, and
to perform a first process relating to determination of a correction value for a signal, which has been sent from the memory controller to the first processing circuit, based on the reference data after the first waiting time has passed,
wherein the second semiconductor memory device includes:
a second memory cell array including a plurality of memory cells;
a second processing circuit configured to write data into the second memory cell array;
a second timer configured to set a second waiting time;
a second command decoder configured to receive a command output from the memory controller; and
a second training circuit configured:
to wait until the second waiting time has passed since the predetermined command is received by the second command decoder, and
to perform a second process relating to the determination of a correction value for a signal, which has been sent from the memory controller to the second processing circuit, based on the reference data after the second waiting time has passed, and
the second waiting time is longer than the first waiting time.

2. The storage device according to claim 1, wherein
the first semiconductor memory device further includes a first storage configured to store first information,
the first timer is configured to determine a length of the first waiting time based on the first information stored in the first storage,
the second semiconductor memory device further includes a second storage configured to store second information different from the first information, and
the second timer is configured to determine a length of the second waiting time based on the second information stored in the second storage.

3. The storage device according to claim 1, wherein the first information is a first address set for the first semiconductor memory device, and the second information is a second address set for the second semiconductor memory device.

4. The storage device according to claim 1, wherein the second waiting time is set to be longer than a period during which the first process is performed by the first training circuit.

5. The storage device according to claim 1, wherein each of the first process and the second process includes a process relating to the determination of a correction value for at least one of a phase of the signal, a waveform shape of the signal, and a duty ratio of the signal.

6. The storage device according to claim 1, further comprising a third semiconductor memory device configured to be controlled by the memory controller,
wherein the memory controller is configured to output the reference data after issuing the predetermined command to the first semiconductor memory device, the second semiconductor memory device, and the third semiconductor memory device,
the third semiconductor memory device includes:
a third memory cell array including a plurality of memory cells;
a third processing circuit configured to write data into the third memory cell array;
a third timer configured to set a third waiting time;
a third command decoder configured to receive a command output from the memory controller.

7. The storage device according to claim 6, wherein the third waiting time is set to be longer than a total of a period during which the first process is performed by the first training circuit and a period during which the second process is performed by the second training circuit.

8. The storage device according to claim 1, wherein the first semiconductor memory device is connected to the memory controller by a first signal line, and the second semiconductor memory device is connected to the memory controller by sharing at least a part of the first signal line.

9. The semiconductor memory device according to claim 1, further comprising:
a storage configured to store unique information,
wherein the first timer is configured to determine a length of the waiting time based on the unique information stored in the storage.

10. The semiconductor memory device according to claim 6, further comprising:
a third training circuit configured
to wait until the third waiting time has passed since the predetermined command is received by the second command decoder, and
to perform a third process relating to the determination of a correction value for a signal, which has been sent from the memory controller to the third processing circuit, based on the reference data after the third waiting time has passed, and
the third waiting time is longer than the second waiting time.

11. The semiconductor memory device according to claim 6, wherein the third waiting time is longer than the second waiting time.

12. The storage device according to claim 6, wherein the third semiconductor memory device is connected to the memory controller by a first signal line, wherein the third semiconductor memory device is connected to the memory controller by sharing at least a part of the first signal line.

* * * * *